United States Patent [19]

Main et al.

[11] Patent Number: 4,491,804
[45] Date of Patent: Jan. 1, 1985

[54] BIAS CIRCUIT WHICH IS INDEPENDENT OF OUTPUT DEVICE VOLTAGE CHARACTERISTICS FOR BIASING AN AMPLIFIER IN CLASS AB OPERATION

[75] Inventors: W. Eric Main; Dennis L. Welty, both of Mesa; Don W. Zobel, Tempe, all of Ariz.

[73] Assignee: Motorola, Inc., Schaumburg, Ill.

[21] Appl. No.: 442,808

[22] Filed: Nov. 18, 1982

[51] Int. Cl.³ .............................................. H03F 3/30
[52] U.S. Cl. .................................. 330/265; 330/268; 330/270
[58] Field of Search .............. 330/265, 267, 268, 270, 330/273, 274

[56] References Cited
U.S. PATENT DOCUMENTS
4,356,452 10/1982 Iwamatsu ...................... 330/273 X

OTHER PUBLICATIONS

Cole, "Class B Amplifier", IBM Technical Disclosure Bulletin, vol. 16, No. 11, Apr. 1974, pp. 3760, 3761.

Primary Examiner—James B. Mullins
Attorney, Agent, or Firm—Michael D. Bingham

[57] ABSTRACT

A Class AB amplifier circuit includes bias circuitry for biasing the output transistor into partial conduction independent of the base-to-emitter voltage of the transistor. The bias circuitry is a simple circuit loop including the output transistor and forms the remainder of the amplifier circuit which can be fabricated in monolithic integrated circuit form. The loop comprises a differential amplifier for providing a substantially constant offset voltage across a pair of terminals between which is connected a current biasing component. The current biasing component is connected in series with the output transistor to produce a small quiescent current to flow therethrough, the value of which is independent of the transistor's characteristics.

24 Claims, 3 Drawing Figures

BIAS CIRCUIT WHICH IS INDEPENDENT OF OUTPUT DEVICE VOLTAGE CHARACTERISTICS FOR BIASING AN AMPLIFIER IN CLASS AB OPERATION

CROSS REFERENCE TO A RELATED APPLICATION

The subject matter of the present invention may be related to the subject matter of pending U.S. Application Ser. No. 305,013, filed Sept. 24, 1981, Entitled "Balanced Current Multiplier Circuit for a Subscriber Loop Interface Circuit", and now U.S. Pat. No. 4,431,874, which is assigned to the assignee of the subject application.

BACKGROUND OF THE INVENTION

The present invention relates to Class AB amplifier circuits and, more particularly, to bias circuitry for biasing the output push-pull transistor stage into partial conduction wherein the quiescent current flowing therethrough is made independent of the output transistor's base-to-emitter voltage.

There are many applications for monolithic integrated amplifiers to provide large currents to direct coupled loads. In order to reduce power consumption in order to prevent undesired heating of the die, the amplifier should be operated in a Class AB mode of operation. Class AB operation is desired over Class B operation because of the more faithful reproduction of the applied input signal at the output of the amplifier. In Class AB operation the amplifier will source and sink current with respect to the load coupled directly thereto.

Distortion at the cross-over point is a particular problem associated with Class AB operated amplifiers, i.e., cross-over is that point where the amplifier switches from sinking current to sourcing current and vice versa. Typically, cross-over distortion is severely limited by biasing the complementary transistor output stage of the amplifier into partial conduction by a small quiescent biasing current that is produced from a bias circuit which is matched to the output devices of the amplifier.

It is important that the bias circuit be matched to the output transistor to maintain low cross-over distortion. However, there may be different applications in which the characteristics of one or the other output transistor cannot be determined so that the bias circuitry cannot be matched thereto. For example, one such application arises with the use of Subscriber Loop Interface Circuits (SLICs) which provide balanced two wire to four wire telephone signal conversion. Most prior art SLICs comprise an integrated circuit having an output power stage which is realized by an external transistor to the SLIC that supplies drive current to the subscriber loop and which is operated in Class AB mode as is known.

The external power device utilized in such SLICs may be a single NPN/PNP power transistor or a Darlington amplifier. For instance, the MC34019 SLIC designed by Motorola, Inc. includes both a NPN and a PNP external transistor coupled between the SLIC and the subscriber loop which are operated in a Class AB mode. As the base-to-emitter voltage ($V_{BE}$) of these external devices is either unknown or may vary from one device to another, there exists a need for producing a quiescent bias current on-chip of the SLIC to bias the external devices partially on, which bias current is made independent of the device characteristics.

SUMMARY OF THE INVENTION

Accordingly, it is an object of the present invention to provide an improved Class AB amplifier circuit.

It is another object of the present invention to provide a Class AB amplifier circuit having an improved bias circuit for biasing the amplifier in a Class AB mode.

Still another object of the present invention is to provide a bias circuit for biasing an amplifier having an output power transistor in a Class AB mode which is independent of the direct current characteristics of the output power transistor.

A further object of the present invention is to provide a monolithic integrated amplifier including an external power transistor in which the amplifier includes a bias circuit for providing a quiescent bias current through the power transistor to maintain the same impartial conduction and in which the bias current is made independent of the power transistor's base-to-emitter voltage characteristics.

A still further object of the present invention is to provide improved bias circuitry for producing a quiescent bias current to render an external transistor that is coupled at the subscriber loop side to a subscriber loop interface circuit partially on wherein the magnitude of the bias current is independent of the base-to-emitter direct current voltage of the external transistor.

In accordance with the above and other objects, there is provided a Class AB amplifier circuit for providing an amplified signal across a load coupled to an output thereof in response to receiving an alternating input signal comprising output drive means including an output transistor connected to the output of the amplifier circuit for producing current through the load when rendered conductive, differential amplifier means for producing a predetermined offset voltage across first and second terminals thereof, current bias means coupled between said first and second terminals of said differential amplifier means to said output transistor for establishing a quiescent bias current therethrough independent to the direct current characteristics of said output transistor, and circuit means for interconnecting said output drive means, said differential amplifier means and said current bias means for causing said offset voltage developed across said current bias means to remain substantially constant independent to said direct current output transistor characteristics.

DETAILED DESCRIPTION OF THE PREFERRED EMBODIMENTS

Figure 1:
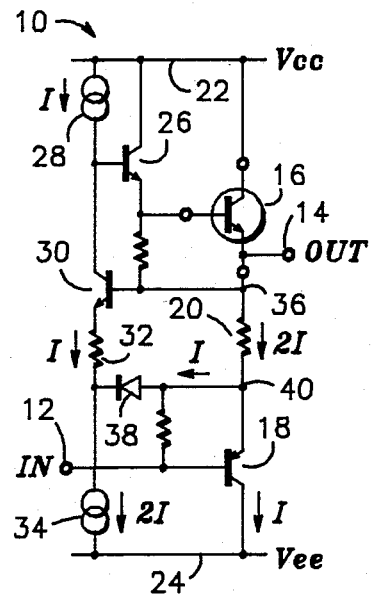
FIG. 1 is a schematic diagram illustrating a Class AB amplifier of one embodiment of the present invention.

Referring to FIG. 1 there is shown Class AB biased amplifier 10 of one embodiment of the present invention. Amplifier 10 is adapted to receive an input signal at terminal 12 which is typically an alternating signal. In response to respective periodic halves of the alternating signal, amplifier 10 can either source or sink current at output terminal 14: amplifier 10 being operated in a Class AB mode of operation to reduce or severely limit cross-over distortion.

Amplifier 10 is generally suited to be manufactured in integrated circuit form. However, as indicated by being drawn within the circle, output transistor 16 may be an external device forming a portion of the output driver section of amplifier 10. Transistor 16 may be a single discrete power device or may be realized in any other circuit form such as a Darlington connected power stage. By utilizing an external power device, load currents may be sourced to terminal 14 which may exceed the power capabilities of the integrated circuit comprising the remainder of the amplifier circuit.

Transistor 16 is coupled in a push-pull configuration with transistor 18 through resistor 20 between the two power supply conductors 22 and 24. The remainder of the output drive section includes transistor 26 which is connected in a Darlington configuration with transistor 16. It is noted that some components are not referenced as they provide only conventional biasing as is well understood. A constant current source 28 is coupled between power supply conductor 22 and the base of transistor 26 to the collector of transistor 30 and provides a constant current of magnitude I. The collector-emitter path of transistor 30 is coupled in series with resistor 32 and constant current source 34. Constant current source 34 sinks a current of magnitude 2I. The base of transistor 30 is coupled to node 36. A diode 38 is connected between the lower end of resistor 32 and node 40.

As illustrated, Class AB amplifier 10 operates predominately in a current sourcing mode. However, current is both sourced and sinked at output 14. As is understood, in response to a positive alternating portion of the input signal transistor 16 is rendered more conductive to source current to the output. Conversely, during the negative alternating half cycle of the applied input signal, transistor 16 is rendered less and less conductive while transistor 18 is rendered more conductive to sink current from the output.

In order to minimize the cross-over distortion that arises due to Class AB operation, it is desirable to provide a small quiescent bias current to maintain transistors 16 and 18 into partial conduction. To ensure minimum cross-over distortion it is important that the biasing circuit utilized to produce the quiescent bias current be matched to the output transistor. However, in the present invention, because transistor 16 is an external power device, its direct current characteristics, for example, the base-to-emitter voltage ($V_{be}$) may not be known. Therefore, it is the intent of the present invention to provide means for biasing transistor 16 into partial conduction, using a stable circuit loop, that is independent of the transistor's $V_{be}$.

The biasing scheme operates in the following manner. Transistor 30 and diode 38 form a differential amplifier having a voltage offset that appears across first and second terminals at nodes 36 and 40. The small voltage offset is made constant and is substantially equal to the value of current I from current source 28 times the value of resistor 32 (IR32). A current of magnitude I is forced through diode 38 such that the current source 34 sinks the current 2I. Hence, a current of 2I is forced through current biasing resistor 20 which is determined by the voltage offset appearing thereacross, the ratio of the resistors and the area ratio of transistor 30 and diode 38 as understood.

Transistors 16, 26, 30 and diode 38 are connected to form a stable circuit loop to force the voltage offset across resistor 32 to be applied across resistor 20. Therefore, the quiescent current, 2I, flowing through current biasing resistor 20 is made independent of the $V_{be}$ drop of transistor 16. Thus, external transistor 16 will be biased into class AB operation by a quiescent current of magnitude to I flowing therethrough. In turn, complementary transistor 18 is biased by a current of magnitude I.

Figure 2:
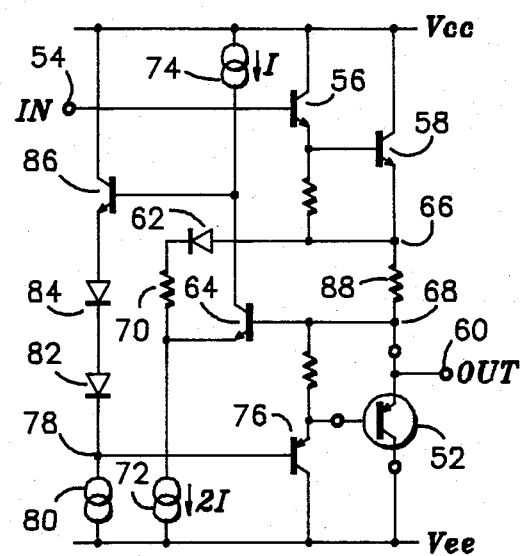
FIG. 2 is a schematic diagram illustrating a Class AB amplifier of another embodiment of the present invention.

Turning now to FIG. 2 there is shown Class AB biased amplifier 50 which includes a PNP transistor 52 that may be external to the amplifier circuit. The biasing means for biasing transistor 52 into partial conduction is essentially the same as discussed above. An input signal to be amplified is applied to terminal 54 which causes current to be sourced from Darlington connected transistors 56 and 58 to the output terminal 60 during a positive alternating half cycle and causes transistor 52 to sink current during a negative half cycle portion. As indicated by external transistor 52 being a PNP device, amplifier 50 predominantly sources current from output 60.

In a similar manner as described for amplifier 10, diode 62 and transistor 64 form a differential amplifier for producing a voltage offset across first and second terminals at node 66 and 68. The voltage offset which is of known magnitude is developed across resistor 70 and is substantially equal to the value of the difference between the magnitude of the current sourced through constant current source 72 and the current sourced from constant current source 74 through transistor 64 times the value of resistor 70.

Transistor 52 is connected in a Darlington configuration with transistor 76. The base of transistor 76 is connected at node 78 to constant current source 80 and through a voltage level shift circuit comprising diodes 82, 84 and transistor 86 to the collector of transistor 64. A circuit loop is formed by transistors 56, 58, 64, 86 and diode 62, 82 and 84 and forces the voltage offset across current biasing resistor 88 to be equal to the voltage developed across resistor 70; resistor 88 being coupled between node 66 and 68. Hence, the quiescent biasing current flowing through resistor 88 is made independent of the $V_{be}$ of transistor 52.

Figure 3:
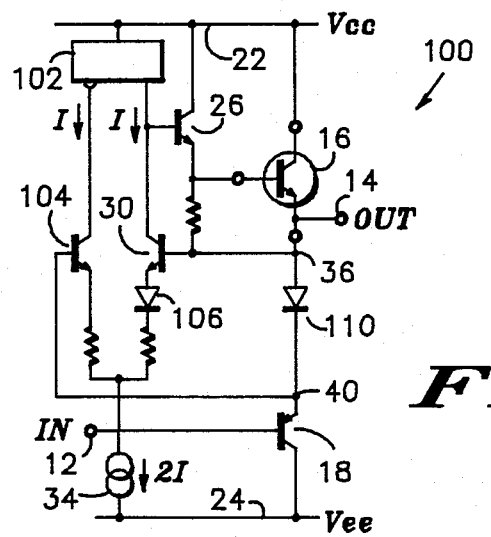
FIG. 3 is a schematic diagram illustrating still another embodiment of the invention.

Referring to FIG. 3 there is shown a Class AB amplifier 100 including a NPN external transistor. Amplifier 100 functions in the same manner as described above with regards to amplifier 10 of FIG. 1 and is shown with components corresponding to like components thereof having the same reference numerals. A current mirror 102 replaces current source 28 and is utilized to force equal currents through transistors 30 and 104 to supply the current sourced by constant current source 34. Transistors 30 and 104 form the differential amplifier previously mentioned wherein a voltage offset is developed across diode 106. This offset voltage is developed across current biasing diode 110 to set the quiesent current flowing through transistor 16 independent of its $V_{be}$ characteristics. The voltage across diode 110 is forced to be equal to the offset voltage developed across diode 106 by the loop comprising transistors 26, 16, 30, 104 and current mirror 102.

The Class AB amplifiers illustrated in FIGS. 1-3 may be utilized as output stages for Subscriber Loop Interface Circuits (SLIC) for driving a subscriber loop as is generally understood. For instance, related pending U.S. patent application Ser. No. 305,013, filed Sept. 24, 1981 and now U.S. Pat. No. 4,431,874, previously mentioned, shows such use of the amplifiers illustrated in the present invention. The SLIC described in this reference pending application discloses the use of external NPN and PNP transistors which may directly correspond to transistor 16 and 52 of the present invention. Thus, in this example, the inputs 12 and 54 of amplifiers 10, 100 and 50 would be connected to the output stage of respective current amplifiers of the SLIC.

Thus, what has been described above, is a novel biasing scheme for biasing output amplifier stages in a Class AB mode of operation independent to the power output devices base-to-emitter voltage characteristics.

We claim:

1. A Class AB amplifier circuit for providing an amplified signal across a load coupled to an output thereof in response to receiving an alternating input signal, comprising:
   output drive means including an output transistor connected to the output of the amplifier circuit for producing current through the load when rendered conductive;
   differential amplifier means for producing a predetermined offset voltage across first and second terminals thereof including;
   a. transistor means for sourcing a current of predetermined value to a first circuit node;
   b. diode means coupled to said first circuit node; and
   c. said transistor means and said diode means being connected respectively to said first and second terminals;
   current bias means coupled between said first and second terminals of said differential amplifier means in series with said output transistor for establishing a quiescent bias current therethrough independent of the direct current characteristics of said output transistor; and
   circuit means for interconnecting said output drive means, said differential amplifier means and said current bias means for causing said offset voltage developed across said current bias means to remain substantially constant independent to said direct current output transistor characteristics 2. The Class AB amplifier circuit of claim 1 wherein said output drive means includes:
   first current source means coupled between a first power supply conductor and said transistor means for supplying said current; and
   a first transistor coupled in a Darlington configuration between said first current source means and said output transistor.

3. The Class AB amplifier of claim 2 including a third transistor having first and second main electrodes coupled between said second terminal of said differential amplifier means and a second power supply conductor and a control electrode coupled to the input of the amplifier circuit at which is received the input signal.

4. The amplifier circuit of claim 3 wherein said differential amplifier means further comprises:
   said transistor means including a fourth transistor having first and second main electrodes and a control electrode, said control electrode being coupled to said first terminal, said second main electrode being coupled to said first current source means;
   a first resistor coupled between said first main electrode of said fourth transistor and said second power supply conductor.

5. The Class AB amplifier circuit of claim 4 wherein said current bias means includes a second resistor.

6. The Class AB amplifier circuit of claim 1 wherein said differential amplifier means further includes:
   said transistor means being a first transistor having first and second main electrodes and a control electrode, said first main electrode being coupled to said first circuit node, said second main electrode receiving said current of predetermined value, said control electrode being coupled to said first terminal;
   said diode means being a first diode having first and second electrodes, said first electrode being coupled to said second terminal and a first resistor coupled between said second electrode of said first diode and said first circuit node; and
   a first current source means coupled between said first circuit node and a first power supply conductor for sinking a current therethrough.

7. The Class AB amplifier circuit of claim 6 further including:
   a second current source means coupled between a second power supply conductor and said second main electrode of said first transistor; and
   voltage level shifting means coupled between said first and second power supply conductors to said second main electrode of said first transistor having a terminal coupled to said output transistor for shifting the level of the voltage between said terminal and said second main electrode of said first transistor by a predetermined amount.

8. The Class AB amplifier circuit of claim 7 wherein said output drive means includes:
   said output transistor having first and second main electrodes and a control electrode, said first and second main electrodes being coupled respectively to said first terminal of said differential amplifier means and said first power supply conductor, said control electrode being coupled to said terminal of said voltage level shifting means; and
   a second transistor having first and second main electrodes and a control electrode, said first main electrode being coupled to said second terminal of said differential amplifier means, said second main electrode being coupled to said second power supply conductor and said control electrode being coupled to the input of the amplifier circuit.

9. The Class AB amplifier circuit of claim 8 wherein said current bias means includes a resistor connected between said first and second terminal of said differential amplifier means.

10. A class AB amplifier circuit for providing an amplfied signal across a load coupled to an output thereof in response to receiving an alternating input signal, comprising:
    output drive means including an output transistor connected to the output of the amplifier circuit for producing current through the load when rendered conductive;
    differential amplifier means for producing a predetermined offset voltage across first and second terminals thereof;
    current bias means coupled between said first and second terminals of said differential amplifier means in series with said output transistor for establishing a quiescent bias current therethrough independent of the direct current characteristics of said output transistor;

circuit means for interconnecting said output drive means, said differential amplifier means and said current bias means for causing said offset voltage developed across said current bias means to remain substantially constant independent to said direct current output transistor characteristics;

said differential amplifier means including;

a. a first transistor having first and second main electrodes and a control electrode, said control electrode being coupled to said first terminal;

b. offset circuit means coupled between said first electrode of said first transistor and a first circuit node for producing said voltage offset thereacross;

c. a second transistor having first and second main electrodes and a control electrode, said control electrode being coupled to said second terminal, said first electrode being coupled to said first circuit node;

d. current source means coupled between said first circuit node and a first power supply conductor; and e. current mirror means coupled between a second power supply conductor and said second main electrodes of said first and second transistors for forcing equal currents thereto.

11. The Class AB amplifier circuit of claim 10 wherein said current bias means includes diode means coupled between said first and second terminals of said differential amplifier means.

12. The Class AB amplifier circuit of claim 11 wherein said output drive means further includes:

said output transistor having first and second main electrodes and a control electrode, said first electrode being coupled to said first terminal of said differential amplifier means to the output of the circuit, said second electrode being coupled to said second power supply conductor;

a third transistor having first and second main electrodes and a control electrode, said first main electrode being coupled to said control electrode of said output transistor, said second main electrode being coupled to said second power supply conductor and said control electrode being coupled to said second main electrode of said first transistor; and a fourth transistor having first and second main electrodes and a control electrode, said first main electrode being coupled to said second terminal of said differential amplifier means, said second main electrode being coupled to said first power supply conductor, said control electrode being coupled to the input of the amplifier circuit.

13. A Class AB monolithic integrated amplifier circuit having an input for receiving an input signal to be amplified and including an external transistor coupled between the amplifier circuit and an output thereof, the improvement comprising:

output drive circuit means for driving the external transistor in response to the input signal;

differential amplifier means for supplying a voltage offset between first and second terminals that is independent of the direct current characteristics of the external transistor, said differential amplifier means including;

a. transistor means for sourcing a current of a predetermined value to a first circuit node;

b. diode means coupled to said first circuit node; and c. said transistor means and said diode means being connected respectively to said first and second terminals;

bias circuit means connected between said first and second terminals of said differential amplifier means in series with the external transistor for producing a quiescent current flow therethrough; and circuit means for connecting said output drive circuit means, said differential amplifier means and said bias circuit means as a stable circuit loop to force said volatge offset to be independent of the direct current characteristics of the external transistor.

14. The Class AB amplifier circuit of claim 13 wherein said output drive means includes:

first current source means coupled between a first power supply conductor and said transistor means for supplying said current; and a first transistor coupled in a Darlington configuration between said first current source means and said output transistor.

15. The Class AB amplifier of claim 14 including a third transistor having first and second main electrodes coupled between said second terminal of said differential amplifier means and a second power supply conductor and a control electrode coupled to the input of the amplifier circuit at which is received the input signal.

16. The amplifier circuit of claim 15 wherein said differential amplifier means further comprises:

said transistor means including a fourth transistor having first and second main electrodes and a control electrode, said control electrode being coupled to said first terminal, said second main electrode being coupled to said first current source means;

a first resistor coupled between said first main electrode of said fourth transistor and said second power supply conductor.

17. The Class AB amplifier circuit of claim 16 wherein said current bias means includes a second resistor.

18. The Class AB amplifier circuit of claim 13 wherein said differential amplifier means further includes:

said transistor means being a first transistor having first and second main electrodes and a control electrode, said first main electrode being coupled to said first circuit node, said second main electrode receiving said current of predetermined value, said control electrode being coupled to said first terminal;

said diode means being a first diode having first and second electrodes, said first electrode being coupled to said second terminal and a first resistor coupled between said second electrode of said first diode and said first circuit node; and a first current source means coupled between said first circuit node and a first power supply conductor for sinking a current therethrough.

19. The Class AB amplifier circuit of claim 18 further including:

a second current source means coupled between a second power supply conductor and said second main electrode of said first transistor; and voltage level shifting means coupled between said first and second power supply conductors to said second main electrode of said first transistor having a terminal coupled to said output transistor for shifting the level of the voltage between said terminal and said second main electrode of said first transistor by a predetermined amount.

20. The Class AB amplifier circuit of claim 19 wherein said output drive means includes:

said output transistor having first and second main electrodes and a control electrode, said first and second main electrodes being coupled respectively to said first terminal of said differential amplifier means and said first power supply conductor, said control electrode being coupled to said terminal of said voltage level shifting means; and a second transistor having first and second main electrodes and a control electrode, said first main electrode being coupled to said second terminal of said differential amplifier means, said second main electrode being coupled to said second power supply conductor and said control electrode being coupled to the input of the amplifier circuit.

21. The Class AB amplifier circuit of claim 20 wherein said current bias means includes a resistor connected between said first and second terminal of said differential amplifier means.

22. A Class AB monolithic integrated amplifier circuit having an input for receiving an input signal to be amplified and including an external transistor coupled between the amplifier circuit and output thereof, the improvement comprising:

output drive circuit means for driving the external transistor in response to the input signal;

differential amplifier means for supplying a voltage offset between first and second terminals that is independent of the direct current charcteristics of the external transistor;

bias circuit means connected between said first and second terminals of said differential amplifier means in series with the external transistor for producing a quiescent current flow therethrough;

circit means for connecting said output drive circuit means, said differential amplifier means and said bias circuit means as a stable circuit loop to force said voltage offset to be independent of the direct current characteristics of the external transistor;

said differential amplifier means including:

a. a first transistor having first and second main electrodes and a control electrode, said control electrode being coupled to said first terminal;

b. offset circuit means coupled between said first electrode of said first transistor and a first circuit node for producing said voltage offset thereacross;

c. a second transistor having first and second main electrodes and a control electrode, said control electrode being coupled to said second terminal, said first electrode being coupled to said first circuit node;

d. current source means coupled between said first circuit node and a first power supply conductor; and e. current mirror means coupled between a second power supply conductor and said second main electrodes of said first and second transistors for forcing equal currents thereto.

23. The Class AB amplifier circuit of claim 22 wherein said current bias means includes diode means coupled between said first and second terminals of said differential amplifier means.

24. The Class AB amplifier circuit of claim 23 wherein said output drive means further includes:

said output transistor having first and second main electrodes and a control electrode, said first electrode being coupled to said first terminal of said differential amplifier means to the output of the circuit, said second electrode being coupled to said second power supply conductor;

a third transistor having first and second main electrodes and a control electrode, said first main electrode being coupled to said control electrode of said output transistor, said second main electrode being coupled to said second power supply conductor and said control electrode being coupled to said second main electrode of said first transistor; and a fourth transistor having first and second main electrodes and a control electrode, said first main electrode being coupled to said second terminal of said differential amplifier means, said second main electrode being coupled to said first power supply conductor, said control electrode being coupled to the input of the amplifier circuit.

* * * * *